United States Patent
Lee et al.

(10) Patent No.: US 8,148,796 B2
(45) Date of Patent: Apr. 3, 2012

(54) SOLAR CELL AND MANUFACTURING METHOD THEREOF

(75) Inventors: Ro-Woon Lee, Seoul (KR); Jae-Woo Joung, Suwon-si (KR); Shang-Hoon Seo, Seoul (KR); Tae-Gu Kim, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 373 days.

(21) Appl. No.: 12/457,001

(22) Filed: May 28, 2009

(65) Prior Publication Data

US 2010/0051104 A1 Mar. 4, 2010

(30) Foreign Application Priority Data

Aug. 28, 2008 (KR) ................ 10-2008-0084701

(51) Int. Cl.
*H01L 31/00* (2006.01)
(52) U.S. Cl. ..... 257/449; 257/22; 257/24; 257/E21.655; 257/E31.126; 257/E27.091; 257/E27.124; 257/E27.125; 257/E27.126; 257/E27.133; 257/E25.009; 136/252; 136/256; 136/261; 438/98; 438/242; 438/245; 438/700
(58) Field of Classification Search ................ None
See application file for complete search history.

(56) References Cited

U.S. PATENT DOCUMENTS

2004/0109666 A1* 6/2004 Kim, II ................. 385/147
2009/0194160 A1* 8/2009 Chin et al. ............ 136/256

FOREIGN PATENT DOCUMENTS

JP 2000-323732 11/2000
JP 2002-16274 1/2002

OTHER PUBLICATIONS

Korean Office Action issued Jul. 12, 2010 in corresponding Korean Patent Application 10-2008-0084701.
Japanese Office Action issued Nov. 8, 2011 in corresponding Japanese Patent Application No. 2009-138596.

* cited by examiner

*Primary Examiner* — Charles Garber
*Assistant Examiner* — Yasser Abdelaziez

(57) ABSTRACT

Disclosed are a solar cell and a manufacturing method thereof. The solar cell in accordance with an embodiment of the present invention includes: a substrate having a plurality of holes formed on one surface thereof; a metal layer formed on an inner wall of the hole and on one surface of the substrate; a p-type semiconductor coated on the metal layer; an n-type semiconductor formed inside the hole and on one surface of the substrate; a transparent conductive oxide formed on the n-type semiconductor; and an electrode terminal formed on the p-type semiconductor and on the transparent conductive oxide.

13 Claims, 12 Drawing Sheets

SOLAR CELL AND MANUFACTURING METHOD THEREOF

CROSS-REFERENCE TO RELATED APPLICATIONS

This application claims the benefit of Korean Patent Application No. 10-2008-0084701, filed with the Korean Intellectual Property Office on Aug. 28, 2008, the disclosure of which is incorporated herein by reference in its entirety.

BACKGROUND

1. Technical Field

The present invention relates to a solar cell and a manufacturing method thereof.

2. Description of the Related Art

A solar cell converts photons into electrical energy by use of characteristic of a semiconductor. The solar cell obtains energy from a reverse operation of a light emitting diode (LED) or a laser diode, which converts electrical energy into light energy. The solar cell technology has been steadily developed and some systems related to the solar cell have been commercialized or are now being rapidly commercialized.

The solar cell is basically a p-n junction diode. There are various kinds of the solar cells, based on their material used for a light absorption layer. A solar cell using silicon as the light absorption layer includes a crystalline (polycrystalline only) wafer type solar cell and a thin-film (crystalline, amorphous) solar cell. In addition, a CdTe or CIS (CuInSe2) compound thin-film solar cell, a III-V group solar cell, a dye-sensitized solar cell and an organic solar cell can be recommended as a representative solar cell.

The biggest problem faced by the photovoltaic power generation technology is the high cost of power generation caused by the high price of the system. The problem acts as the biggest obstacle to the wide spread of the photovoltaic power generation technology. Considering that a silicon substrate solar cell (polycrystalline only) has a market share of more than 90%, it can be understood that the present high price of the photovoltaic power generation system is caused by the high price of solar modules, i.e., high price of silicon substrates constituting the solar cell. Accordingly, it is possible to remarkably reduce the high prices of the solar cell and the system by manufacturing an element by depositing minimum materials required for manufacturing the solar cell on an inexpensive substrate in the form of a thin film, instead of the silicon substrate, which is a main factor of the high system price.

Major thin-film solar cells include the silicon-based solar cell, the CuInSe2-based solar cell and the CdTe thin-film solar cell, depending on the light absorption layer material. Such thin-film solar cells have an advantage of using an inexpensive substrate such as a glass plate or a metal plate instead of the expensive silicon substrate, and of being manufactured at a low cost by consuming a minimum amount of materials through the deposition of a thin film having thickness of about several micrometers. It is possible to improve the productivity and lower the price by manufacturing a wide-area module through the use of an in-line process.

A solar cell using a glass plate is shown in FIG. 1 as an example of a silicon thin-film solar cell. A glass plate 1 is used as a substrate, and a transparent conductive oxide 2 is deposited on one surface of the glass plate 1. Subsequently, an n-type semiconductor 3 and a p-type semiconductor 4 are successively deposited so that a p-n junction is made. A light beam is incident on the surface of the glass plate 1 and passes through the transparent conductive oxide 2 and the n-type semiconductor 3. Then, the light beam is absorbed by the p-type semiconductor 4. In this case, an electromotive force causes an excited electron to flow, and then electric power can be obtained.

SUMMARY

The present invention provides a silicon thin-film solar cell capable of widening a surface area for collecting light and preventing a diffuse reflection of light, and a manufacturing method thereof.

An aspect of the present invention features a method of manufacturing a solar cell. The method in accordance with an embodiment of the present invention can include: forming a plurality of holes on one surface of a substrate; forming a metal layer on an inner wall of the hole and on one surface of the substrate; coating a p-type semiconductor on the metal layer; forming an n-type semiconductor inside the hole and on one surface of the substrate; forming a transparent conductive oxide on the n-type semiconductor; and forming an electrode terminal on the p-type semiconductor and on the transparent conductive oxide.

The forming of the hole can be formed through an anodizing process. Especially, the anodizing process can be performed in a hydrofluoric acid solution by using a p-type silicon wafer as the substrate.

The transparent conductive oxide can have a micro lens shape. The transparent conductive oxide can be formed by printing ink containing a material constituting the transparent conductive oxide on the n-type semiconductor by using an inkjet method The forming of the transparent conductive oxide can include: discharging a first ink droplet containing a material constituting the transparent conductive oxide on the n-type semiconductor; hardening the first ink droplet; and discharging adjacently to the first ink droplet a second ink droplet containing a material constituting the transparent conductive oxide.

The forming of the n-type semiconductor can be performed by an inkjet method. The forming of the electrode terminal can include printing conductive ink with an inkjet method.

Another aspect of the present invention features a solar cell. The solar cell in accordance with an embodiment of the present invention can include: a substrate having a plurality of holes formed on one surface thereof; a metal layer formed on an inner wall of the hole and on one surface of the substrate; a p-type semiconductor coated on the metal layer; an n-type semiconductor formed inside the hole and on one surface of the substrate; a transparent conductive oxide formed on the n-type semiconductor; and an electrode terminal formed on the p-type semiconductor and on the transparent conductive oxide.

A p-type silicon wafer can be used as the substrate. The transparent conductive oxide can have a micro lens shape. The plurality of holes can have the same size and can be formed at regularly intervals.

DETAILED DESCRIPTION

Figure 1:
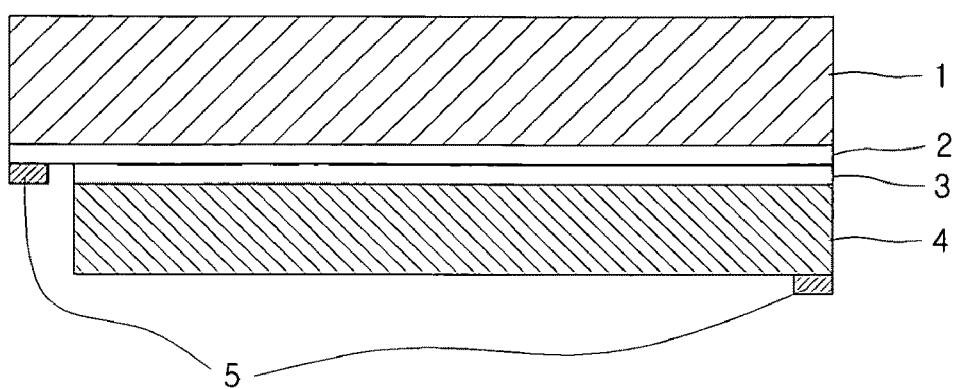
FIG. 1 is a cross sectional view showing a substrate-type solar cell.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. In the following description of the present invention, the detailed description of known technologies incorporated herein will be omitted when it may make the subject matter unclear.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, embodiments of a solar cell and a manufacturing method thereof in accordance with the present invention will be described in detail with reference to the accompanying drawings. In description with reference to accompanying drawings, the same reference numerals will be assigned to the same or corresponding elements, and repetitive descriptions thereof will be omitted.

Figure 2:
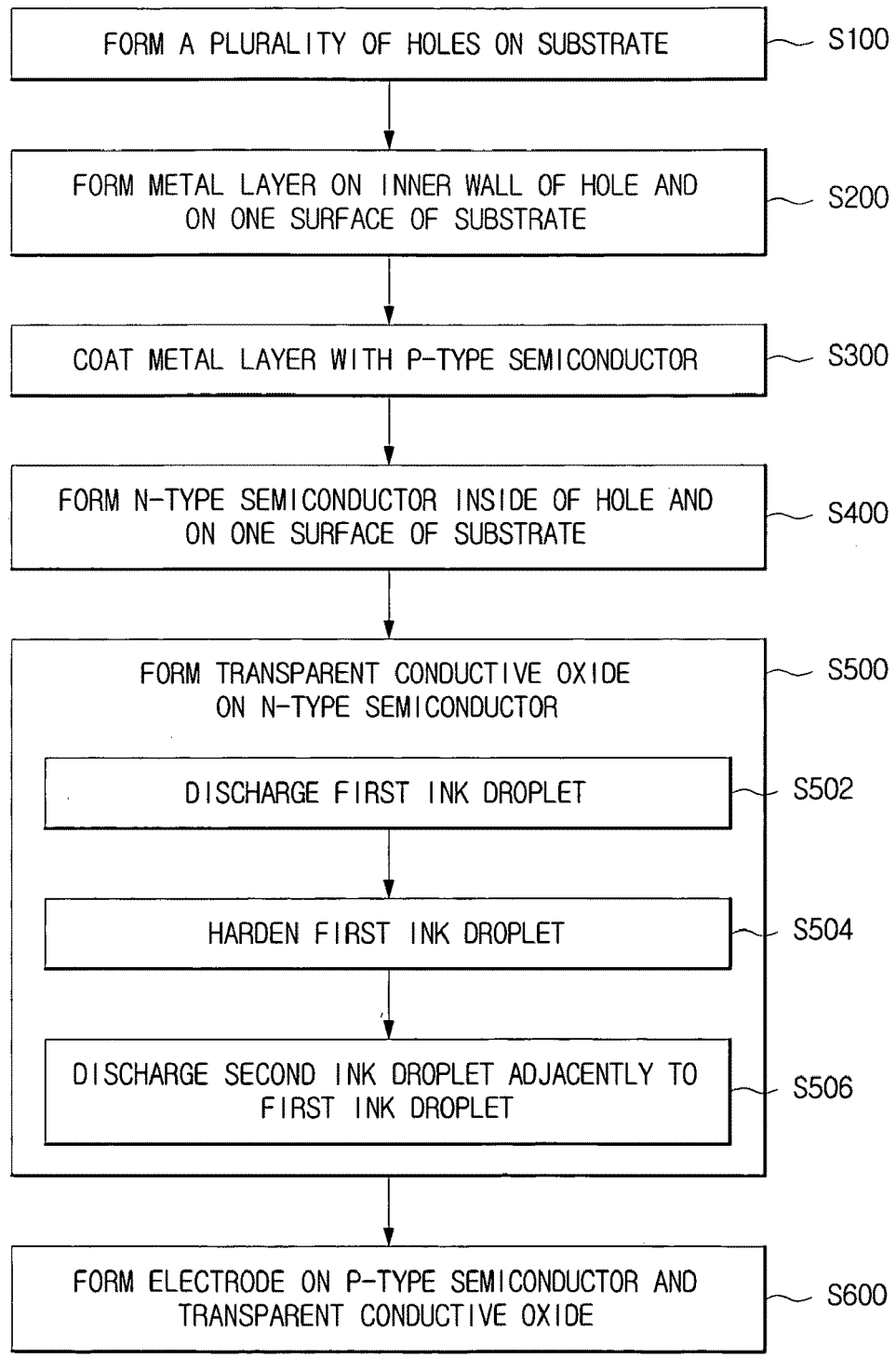
FIG. 2 is a flowchart showing a method of manufacturing a solar cell according to an embodiment of the present invention.

FIG. 2 is a flowchart showing a method of manufacturing a solar cell according to an embodiment of the present invention. FIGS. 3 through 8 are views showing a method of manufacturing a solar cell according to an embodiment of the present invention. In FIGS. 3 through 8, illustrated are a substrate 10, a hole 15, a metal layer 20, a p-type semiconductor 30, an n-type semiconductor 40, a transparent conductive oxide 50, a first ink droplet 51, a second ink droplet 52 and an electrode terminal 60.

Figure 3:
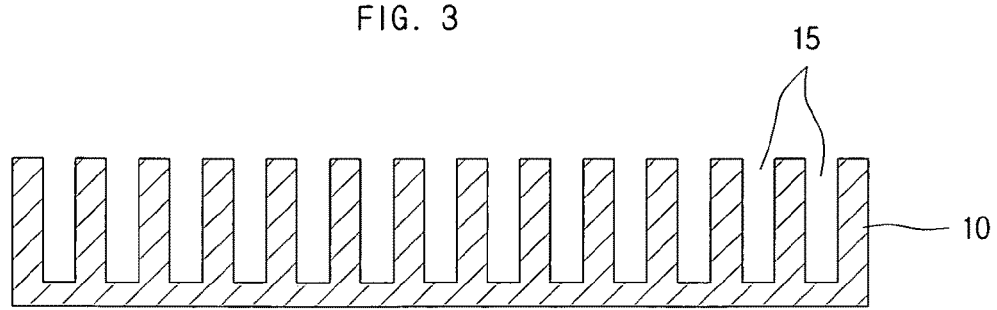
FIGS. 3 through 8 are views showing a method of manufacturing a solar cell according to an embodiment of the present invention.

As shown in FIG. 3, a plurality of holes 15 are formed on a substrate 10 (S100). The substrate 10 is both a base of a solar cell and a structure of a base necessary for forming each layer. While the substrates 10 of various materials can be used, it is preferable for the substrate 10 to be made of a material having hardness suitable for forming the hole 15 in the substrate 10.

The hole 15 can be formed by anodizing the surface of the substrate 10, which is one of the methods of forming the hole 15. The anodizing process is used for treating a surface by adding an anode to an object (the substrate 10 in the present invention) and by adding a cathode to a solution. The surface becomes rugged and porous through the anodizing process. The effect of the anodizing varies according to the kind of the added solution. The added solution is an acid solution, such as sulfuric acid, chromic acid, hydrofluoric acid and so on.

Figure 10:
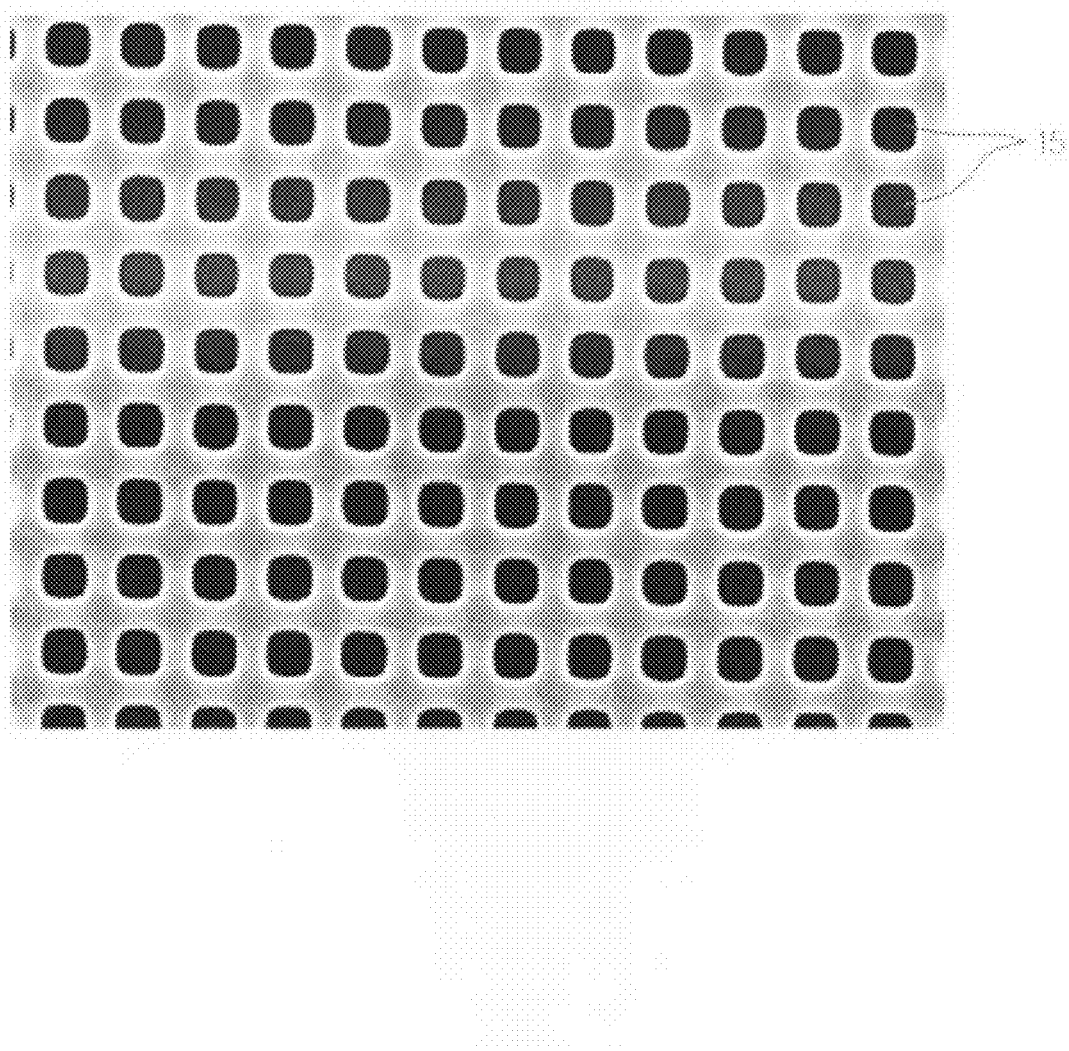
FIG. 10 is a plan view showing a shape of holes of a solar cell according to another embodiment of the present invention.
Figure 11:
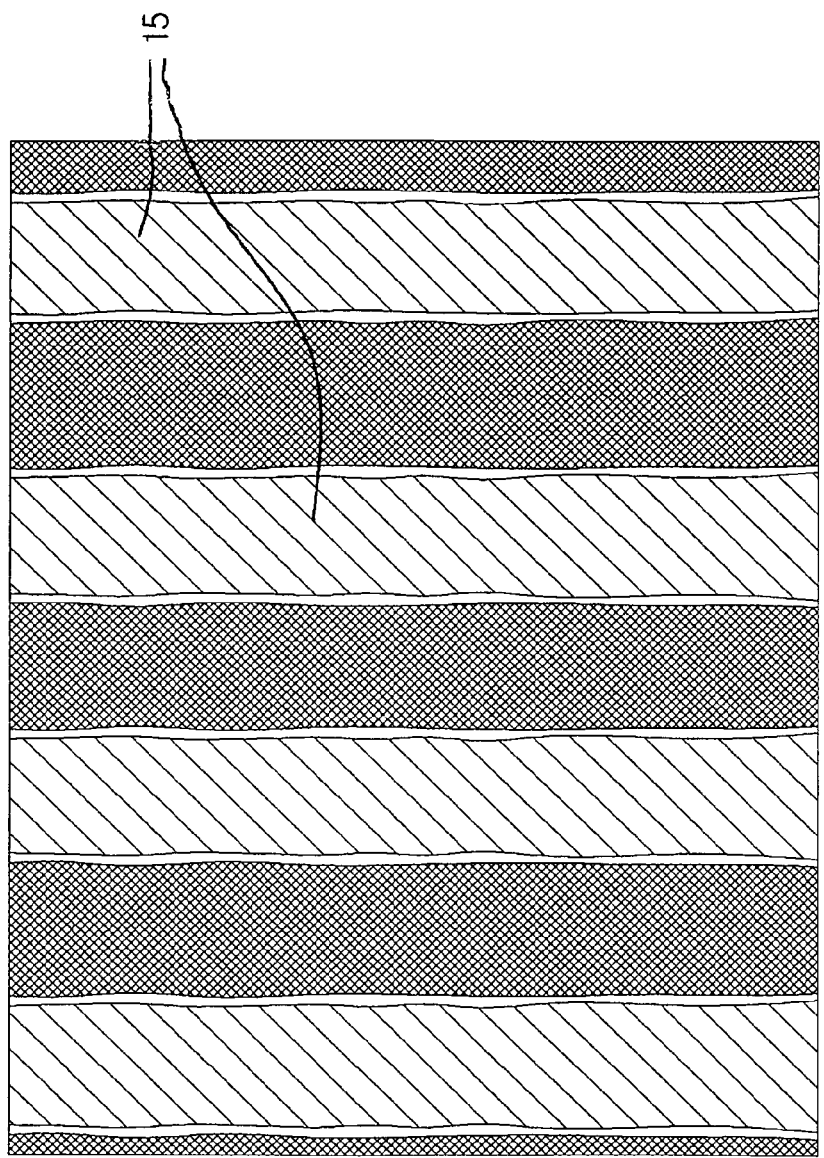
FIG. 11 is a cross sectional view showing a shape of holes of a solar cell according to another embodiment of the present invention.

In order to perform the anodizing, a p-type silicon wafer can be used as the substrate 10. FIG. 10 is a photograph showing a p-type silicon wafer anodized by the hydrofluoric acid (HF). In FIG. 10, the holes 15 are formed at regularly spaced intervals by the anodizing process. The size of the hole 15 can be varied by adjusting the time taken for anodizing. FIG. 11 is a cross sectional view showing a p-type silicon wafer anodized by the hydrofluoric acid (HF). It can be noted that the long and thin holes 15 have been formed, which have the thickness of about from 1 to 2 micrometers.

Such formed holes 15 increase a p-n junction area absorbing the light and have an advantage capable of condensing the greater amount of light by using the substrate 10 having the same size. Besides, while a light beam having entered inside the hole 15 reflects from the inner wall of the hole, the light beam reflects from the opposite inner wall. In the end, the light beam is absorbed inside the hole and not able to easily escape from the hole 15. Accordingly, the efficiency can be prevented from being reduced due to the reflection of the light.

Figure 4:
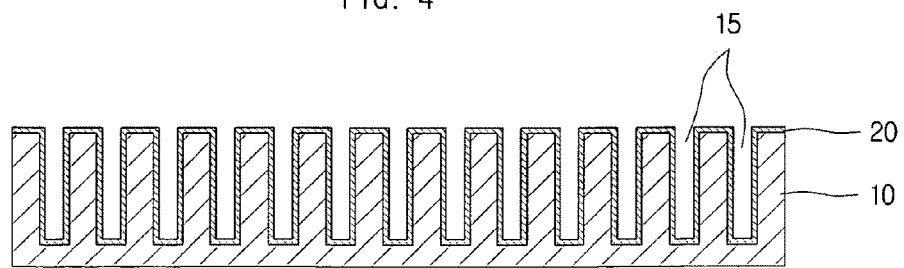

As shown in FIG. 4, a metal layer 20 is formed on the inner wall of the hole 15 and on one surface of the substrate 10 (S200). The metal layer 20 is formed in the form of a thin film by spreading a conductive material on one surface of the substrate 10 as well as the inner wall of the hole 15. To this end, various methods of forming a thin film can be used, for example, sputtering, E-beam evaporation, thermal evaporation, laser molecular beam epitaxy (L-MBE) and pulsed laser deposition (PLD). The metal layer 20 contacts with a p-type semiconductor 30 and electrically connects the p-type semiconductor 30 with an electrode terminal 60, which are described below.

Figure 5:
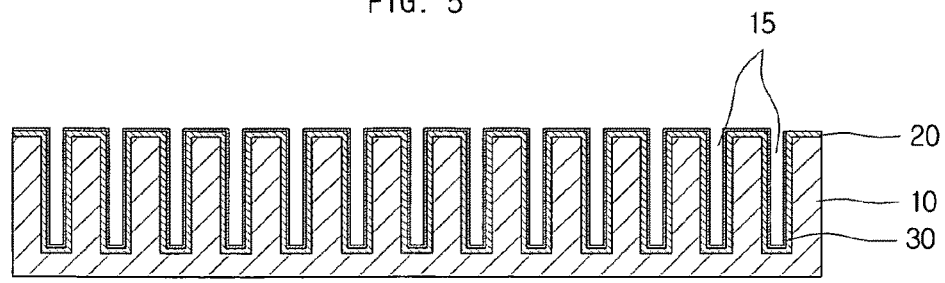

Next, as shown in FIG. 5, the p-type semiconductor 30 is coated on the metal layer 20 (S300). Through doping process of reducing resistance by adding impurities to group 4 elements of semiconductor materials, such as silicon (Si), germanium (Ge) and so on, the number of electron holes is increased, and then the p-type semiconductor 30, which has low resistance due to increase of conductivity, is hereby produced.

In order to increase the number of the electron holes in pure semiconductor, elements of impurities such as aluminium (Al), boron (B), gallium (Ga), indium (In) and so on can be added. More detailed description will be given taking an example of boron. If boron is added to pure silicon, they try to form a covalent bond with each other. But, since silicon has four covalence electrons while boron has three covalence electrons, one electron is necessary for forming the covalent bond. In this case, a hole generated by shortage of electron is defined as an electron hole. In the p-type semiconductor, the electron holes having more positively (+) charged electricity than that of free electrons become a carrier.

The p-type semiconductor is formed on the metal layer in the form of a thin film. Similarly to the method of forming the metal layer, it is possible to use sputtering, E-beam evaporation, thermal evaporation, laser molecular beam epitaxy (L-MBE) and pulsed laser deposition (PLD).

Figure 6:
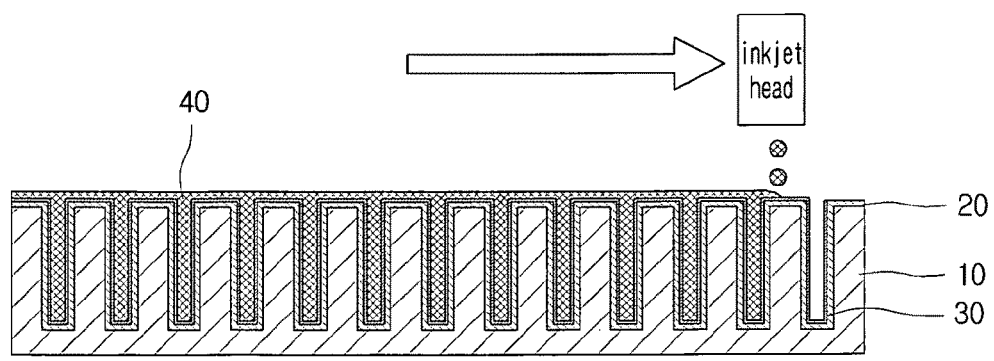

As shown in FIG. 6, an n-type semiconductor 40 is formed inside of the hole 15 and on one surface of the substrate 10 (S400). While the drawing shows a method of spreading through an inkjet head, the method is not limited to the inkjet head. So long as a method of filling the hole with the n-type semiconductor 40 and of covering one surface of the substrate with the n-type semiconductor 40 is used, the method can be used as a coating method.

If a part of crystal structure of quadrivalent atoms such as silicon and germanium is replaced by pentavalent atoms such as phosphorus, arsenic and antimony, one electron is not necessary for the pentavalent atom to form the covalent bond. The one electron becomes a free electron that can freely pass between atoms. Such an impurity atom ionized by losing an electron is defined as a donor and a semiconductor having donor having been doped in the quadrivalent atom is defined as the n-type semiconductor 40. Since the n-type semiconductor 40 provides an electron and the p-type semiconductor receives the electron, electron flow, that is, electrical current flows caused by electron density gradient between p-n type semiconductors.

Figure 7:
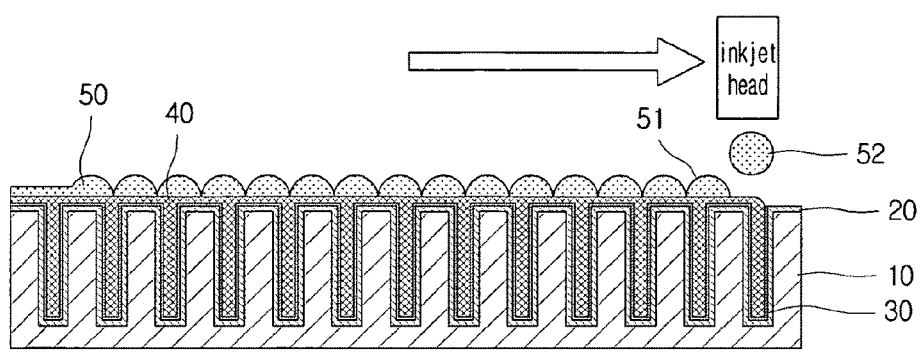

As shown in FIG. 7, a transparent conductive oxide 50 is formed on the n-type semiconductor 40 (S500). The transparent conductive oxide 50 does not reflect light and transmits light to the n-type semiconductor 40. The transparent conductive oxide 50 is made of a material, which is transparent and has conductivity, such as ITO, ZnO and so on. In particular, as shown in FIG. 7, when the transparent conductive oxide 50 has a micro hemisphere lens shape, incident light is transmitted without loss, and interface surface area between the transparent conductive oxide 50 and the n-type semiconductor 40 is increased. Accordingly, since as many electrons as possible are excited, it is possible to manufacture more efficient solar cell.

The micro hemisphere lens can print by discharging ink droplet having a size of scores of micrometers through the use of an inkjet method. That is, in the process of printing ink containing a material constituting the transparent conductive oxide 50 by means of the inkjet method, a second ink droplet 52 is discharged while a first ink droplet 51 is hardened and has the hemisphere shape by providing a discharging time delay between the first ink droplet 51 and the second ink droplet 52 adjacent thereto.

Therefore, in order to form the micro lens-shaped transparent conductive oxide 50 according to the embodiment of the present invention, after the first ink droplet 51 is discharged (S502) and the first ink droplet 51 adhered on the n-type semiconductor 40 is allowed to be hardened (S504), the second ink droplet 52 is discharged adjacently to the first ink droplet 51 (S506).

The ink droplet can be hardened by a method of discharging the droplet at a predetermined time interval and a method of drying the adhered ink droplet by heating the substrate 10 or irradiating ultraviolet rays into the ink droplet. For the purpose of discharging the second ink droplet 52 adjacently to the first ink droplet 51 after hardening the first ink droplet 51, the ink droplet can be discharged at a time interval enough to harden the first ink droplet as shown in FIG. 7. After the first ink droplet 51 is discharged such that the first ink droplet 51 is separated from each other at a predetermined interval and is hardened, it is also possible to discharge the second ink droplet 52 in the space between the first ink droplets 51.

In order to discharge the ink droplet again between the adhered ink droplets after discharging the ink droplet separately at a predetermined interval, it is preferable to decide the most efficient discharging method in consideration of a discharging interval of the ink droplet, the size of the space between the adhered ink droplets, a time taken for hardening the ink droplet and so on.

Figure 8:
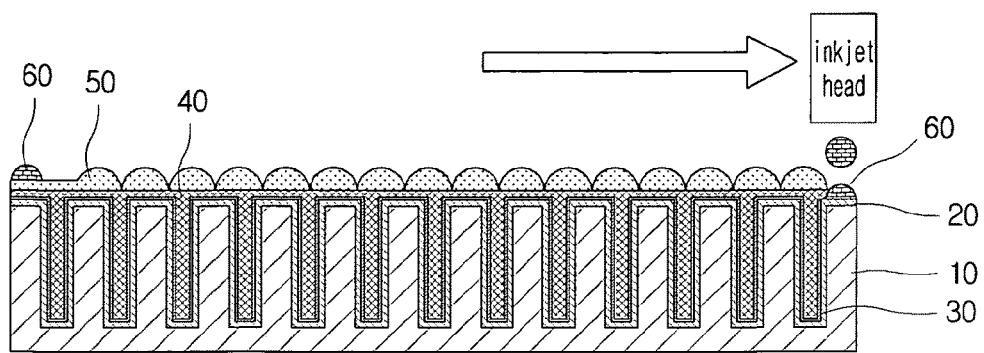

Next, an electrode terminal 60 is formed on the p-type semiconductor 30 and the transparent conductive oxide 50 (S600). The electrode terminal 60 performs both a positive terminal and a negative terminal of the solar cell. As shown in FIG. 8, conductive metal is formed on the transparent conductive oxide 50 and the exposed p-type semiconductor 30. A thin film deposition method as well as a method of printing by means of the inkjet method illustrated in FIG. 8 can be used as the method of forming the conductive metal.

In the foregoing, the method of manufacturing the solar cell by using the anodizing method has been described. Hereinafter, a solar cell structure having a surface area increased by forming a hole in the substrate will be described.

Figure 9:
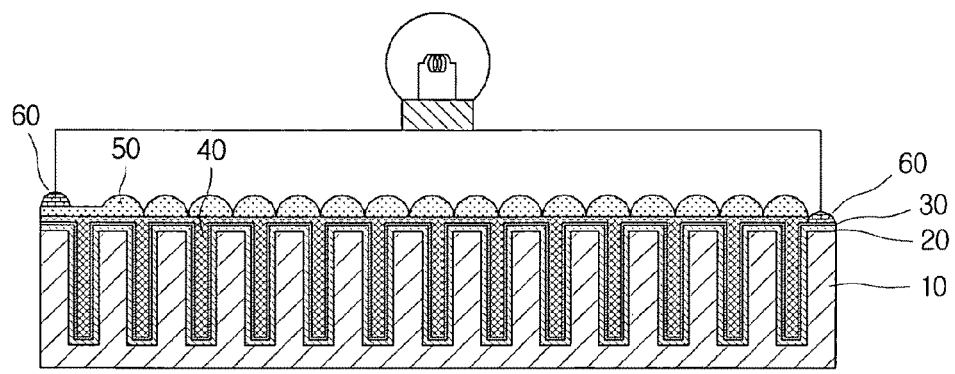
FIG. 9 is a cross sectional view showing a solar cell according to another embodiment of the present invention.

FIG. 9 is a cross sectional view showing a solar cell according to another embodiment of the present invention. Illustrated are a substrate 10, a hole 15, a metal layer 20, a p-type semiconductor 30, an n-type semiconductor 40, a transparent conductive oxide 50, a first ink droplet 51, a second ink droplet 52 and an electrode terminal 60.

A substrate 10 is a structure of a base for a layered structure of the solar cell. The material of the substrate is not limited. A p-type silicon wafer can be used as a material of the substrate so as to form a hole 15 by the anodizing method.

It has been described in the foregoing that the hole 15 can be formed on the substrate 10 by a mechanical method or through surface treatment by the anodizing method. The metal layer 20 and the p-type semiconductor 30 can be formed on the inner wall of the hole 15 and on one surface of the substrate 10. An n-type semiconductor 40 is formed on one surface of the substrate 10. Here, the n-type semiconductor 40 is also filled inside the hole 15.

Since a p-n junction area in which the n-type semiconductor 40 is contacted with the p-type semiconductor 30 by the hole 15 is widened, the efficiency of the solar cell having the same area can be enhanced. Additionally, because the incident light reflects within the hole 15, the light is absorbed by the p-type semiconductor 30 in the end. Consequently, the incident light inside the semiconductor is almost available.

A transparent conductive oxide 50 is formed on the n-type semiconductor 40. The transparent conductive oxide 50 performs a function of a layer collecting the light. If the transparent conductive oxide 50 is formed in the form of a micro lens, the light that is additionally incident is prevented from being lost and more electrons are excited so that the performance of the solar cell can be improved.

Figure 12:
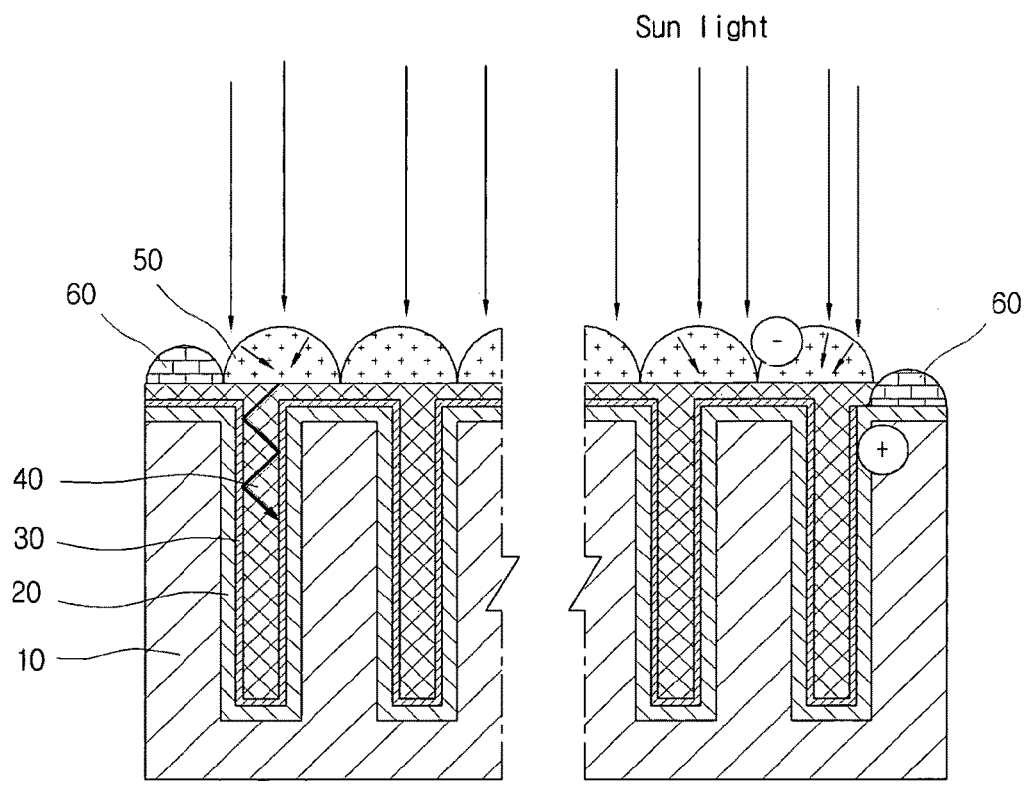
FIG. 12 is a conceptual diagram showing a principle of how a solar cell is operated according to another embodiment of the present invention.

FIG. 12 is a conceptual diagram showing a principle of operation of a solar cell according to another embodiment of the present invention. The flow of light through a micro lens is shown. As the micro lens-shaped transparent conductive oxide 50 allows the incident light to be transmitted to the n-type semiconductor 40 along arrows without diffuse reflection, as many electrons as possible can be excited. Therefore, it is possible to increase the efficiency of the solar cell.

An electrode terminal 60 is formed on the metal layer 20 and the transparent conductive oxide 50 and is made of a conductive material. The electrode terminal 60 is a path of the electron owing to ion density gradient between the p-type semiconductor 30 and the n-type semiconductor 40.

The solar cell described above is able to widen an area condensing the light by maximizing the area absorbing the light by the anodizing method and prevent the diffuse reflection of light and increase the light absorption rate by using a micro sized transparent conductive oxide having a sphere shape.

While the present invention has been described with reference to exemplary embodiments thereof, it will be understood by those skilled in the art that various changes and modification in forms and details may be made without departing from the spirit and scope of the present invention as defined by the appended claims.

Numerous embodiments other than embodiments described above are included within the scope of the present invention.

What is claimed is:

1. A method of manufacturing a solar cell comprising:
forming a plurality of holes on one surface of a substrate;
forming a metal layer on an inner wall of the hole and on one surface of the substrate;
coating a p-type semiconductor on the metal layer;
forming an n-type semiconductor inside the hole and on one surface of the substrate;
forming a transparent conductive oxide on the n-type semiconductor; and
forming an electrode terminal on the p-type semiconductor and on the transparent conductive oxide.

2. The method of claim 1, wherein the forming of the hole comprises an anodizing process.

3. The method of claim 2, wherein the anodizing process is performed in a hydrofluoric acid solution.

4. The method of claim 2, wherein the substrate is a p-type silicon wafer.

5. The method of claim 1, wherein the transparent conductive oxide has a micro lens shape.

6. The method of claim 5, wherein the forming of the transparent conductive oxide comprises printing ink containing a material constituting the transparent conductive oxide on the n-type semiconductor by using an inkjet method.

7. The method of claim 6, wherein the forming of the transparent conductive oxide comprises:
discharging a first ink droplet containing a material constituting the transparent conductive oxide on the n-type semiconductor;
hardening the first ink droplet; and
discharging adjacently to the first ink droplet a second ink droplet containing a material constituting the transparent conductive oxide.

8. The method of claim 1, wherein the forming of the n-type semiconductor is performed by an inkjet method.

9. The method of claim 1, wherein the forming of the electrode terminal comprises printing conductive ink with an inkjet method.

10. A solar cell comprising:
a substrate having a plurality of holes formed on one surface thereof;
a metal layer formed on an inner wall of the hole and on one surface of the substrate;
a p-type semiconductor coated on the metal layer;
an n-type semiconductor formed inside the hole and on one surface of the substrate;
a transparent conductive oxide formed on the n-type semiconductor; and
an electrode terminal formed on the p-type semiconductor and on the transparent conductive oxide.

11. The solar cell of claim 10, wherein the substrate is a p-type silicon wafer.

12. The solar cell of claim 10, wherein the transparent conductive oxide has a micro lens shape.

13. The solar cell of claim 10, wherein the plurality of holes have the same size and are formed at regularly intervals.

* * * * *